US012590985B2

(12) United States Patent
Tang et al.

(10) Patent No.: US 12,590,985 B2
(45) Date of Patent: Mar. 31, 2026

(54) MEMS ACCELEROMETER WITH VERTICAL STOPS

(71) Applicant: STMicroelectronics International N.V., Geneva (CH)

(72) Inventors: Jun Tang, Gilbert, AZ (US); Jinglun Li, Chandler, AZ (US); Andrew C. McNeil, Chandler, AZ (US); Aaron A. Geisberger, Austin, TX (US)

(73) Assignee: STMicroelectronics International N.V., Geneva (CH)

( * ) Notice: Subject to any disclaimer, the term of this patent is extended or adjusted under 35 U.S.C. 154(b) by 341 days.

(21) Appl. No.: 18/295,232

(22) Filed: Apr. 3, 2023

(65) Prior Publication Data

US 2024/0329076 A1 Oct. 3, 2024

(51) Int. Cl.
G01P 15/08 (2006.01)
B81C 1/00 (2006.01)

(52) U.S. Cl.
CPC .......... G01P 15/08 (2013.01); B81C 1/00198 (2013.01); *G01P 2015/0837* (2013.01)

(58) Field of Classification Search
CPC ............. G01P 15/08; G01P 2015/0837; G01P 2015/0857; G01P 2015/0871; G01P 2015/0874; G01P 15/125; G01P 15/0802; G01P 2015/0862; B81C 1/00198
See application file for complete search history.

(56) References Cited

U.S. PATENT DOCUMENTS

| | | | |
|---|---|---|---|
| 6,122,963 A | 9/2000 | Hammond et al. | |
| 2011/0203373 A1* | 8/2011 | Konno | G01P 15/0802 |
| | | | 73/514.32 |
| 2012/0055249 A1 | 3/2012 | Miyatake et al. | |
| 2012/0272735 A1* | 11/2012 | Neul | G01P 15/097 |
| | | | 73/514.04 |
| 2017/0363424 A1 | 12/2017 | Maspero et al. | |
| 2019/0120872 A1* | 4/2019 | Geisberger | G01P 15/125 |
| 2022/0120781 A1 | 4/2022 | Reinmuth | |

* cited by examiner

*Primary Examiner* — Xin Y Zhong
(74) *Attorney, Agent, or Firm* — Seed Intellectual Property Law Group LLP

(57) ABSTRACT

A MEMS device includes a substrate, a set of spring, and a proof mass suspended above and coupled to the substrate by the springs. Each spring includes a corresponding anchor on the substrate and a beam extending away from that anchor. Each beam has a fixed end that is coupled to the anchor by a first linkage at one end of the beam proximal to the anchor and a free end that is coupled to the proof mass by a second linkage at an end of the beam that is distal to the anchor. The anchors are arranged symmetrically around a center of the proof mass. The proof mass translates vertically with respect to the substrate and when a vertical displacement of the proof mass toward the substrate reaches a predefined value, the free end of each spring contacts the substrate and prevents the proof mass from contacting the substrate.

15 Claims, 6 Drawing Sheets

MEMS ACCELEROMETER WITH VERTICAL STOPS

FIELD OF THE INVENTION

Embodiments of the subject matter described herein relate to microelectromechanical systems used in accelerometers.

BACKGROUND OF THE INVENTION

Accelerometers can be implemented as microelectromechanical systems (MEMS) that include a proof mass that moves in response to acceleration while coupled to a substrate by springs. The motion of the proof mass can cause changes in the capacitance of an electrical circuit which is used to convert motion of the proof mass into electrical signals. In some such MEMS accelerometers, the proof mass pivots about a fixed pivot point in response to acceleration, while in other MEMS accelerometers, the proof mass translates linearly along an axis in response to acceleration.

SUMMARY OF THE INVENTION

In an example embodiment, a device includes a substrate, a set of spring assemblies, and a proof mass suspended above the substrate and coupled to the substrate by the set of spring assemblies. The proof mass is configured to move along a vertical direction toward and away from the substrate when the proof mass experiences an acceleration force along the vertical direction. Each spring assembly belonging to the set of spring assemblies includes an anchor disposed on the substrate and a beam having a fixed end and free end. The fixed end is coupled to the substrate and the free end is free to translate vertically with respect to the proof mass and free to translate vertically with respect to the substrate. Each spring assembly also includes a first linkage coupling the fixed end of the beam to the anchor and a second linkage coupling the beam to the proof mass at a location between the fixed end and the free end of the beam.

The anchors of each spring assembly are disposed symmetrically along a circular path centered around a center of the proof mass. When the proof mass is at rest, the spring assemblies are disposed within openings in the proof mass. The beam of each spring assembly extends from the anchor of that spring assembly toward a corresponding corner of the proof mass and a long axis of the beam of each spring assembly is oriented toward the center of the proof mass.

The spring assemblies and the proof mass are jointly configured such that, when a vertical displacement of the proof mass toward the substrate reaches a predefined value, the free end of each spring assembly contacts the substrate and prevents the proof mass from contacting the substrate.

In another example embodiment, a method includes forming, on a substrate, a set of spring assemblies, and a proof mass suspended above the substrate and coupled to the substrate by the set of spring assemblies. The proof mass is configured to move along a vertical direction toward and away from the substrate when the proof mass experiences an acceleration force along the vertical direction. Forming each spring assembly belonging to the set of spring assemblies includes forming an anchor disposed on the substrate and forming a beam having a fixed end and free end. The fixed end is coupled to the substrate and the free end is free to translate vertically with respect to the proof mass and free to translate vertically with respect to the substrate. Each spring assembly also includes a first linkage coupling the fixed end of the beam to the anchor and a second linkage coupling the beam to the proof mass at a location between the fixed end and the free end of the beam.

The anchors of each spring assembly are disposed symmetrically along a circular path centered around a center of the proof mass. When the proof mass is at rest, the spring assemblies are disposed within openings in the proof mass. The beam of each spring assembly extends from the anchor of that spring assembly toward a corresponding corner of the proof mass and a long axis of the beam of each spring assembly is oriented toward the center of the proof mass.

The spring assemblies and the proof mass are jointly configured such that, when a vertical displacement of the proof mass toward the substrate reaches a predefined value, the free end of each spring assembly contacts the substrate and prevents the proof mass from contacting the substrate.

BRIEF DESCRIPTION OF THE DRAWINGS

The present disclosure is illustrated by way of examples, embodiments and the like and is not limited by the accompanying figures, in which like reference numbers indicate similar elements. Elements in the figures are illustrated for simplicity and clarity and have not necessarily been drawn to scale. The figures along with the detailed description are incorporated and form part of the specification and serve to further illustrate examples, embodiments and the like, and explain various principles and advantages, in accordance with the present disclosure, wherein.

DETAILED DESCRIPTION

Figure 1:
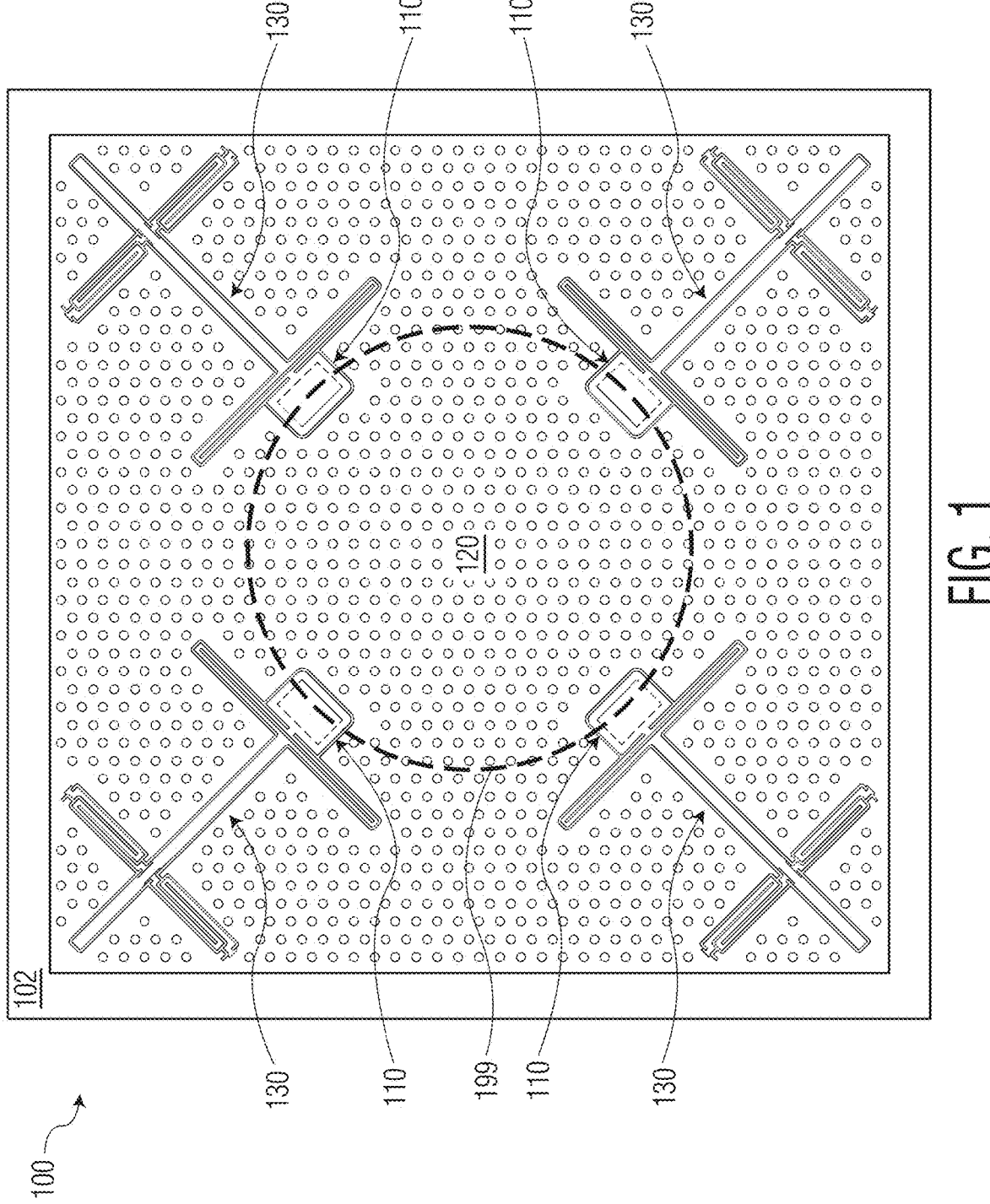
FIG. 1 is a plan view of an accelerometer according to one or more embodiments.

The following detailed description provides examples for the purposes of understanding and is not intended to limit the invention or the application and uses of the same. Furthermore, there is no intention to be bound by any expressed or implied theory presented in the preceding technical field, background, or the following detailed description.

For simplicity and clarity of illustration, the drawing figures illustrate the general manner of construction, and descriptions and details of well-known features and techniques may be omitted to avoid unnecessarily obscuring the invention. Additionally, elements in the drawing figures are not necessarily drawn to scale. For example, the dimensions of some of the elements or regions in the figures may be exaggerated relative to other elements or regions to help improve understanding of embodiments of the invention.

The terms "first," "second," "third," "fourth" and the like in the description and the claims, if any, may be used for distinguishing between similar elements and not necessarily for describing a particular sequential or chronological order. It is to be understood that the terms so used are interchangeable under appropriate circumstances such that the embodiments of the invention described herein are, for example, capable of operation in sequences other than those illustrated or otherwise described herein. Furthermore, the terms "comprise," "include," "have" and any variations thereof, are intended to cover non-exclusive inclusions, such that a process, method, article, or apparatus that comprises a list of elements is not necessarily limited to those elements but may include other elements not expressly listed or inherent to such process, method, article, or apparatus. The term "coupled," as used herein, is defined as directly or indirectly connected in an electrical or non-electrical manner. As used herein the terms "substantial" and "substantially" mean sufficient to accomplish the stated purpose in a practical manner and that minor imperfections, if any, are not significant for the stated purpose.

Directional references such as "top," "bottom," "left," "right," "above," "below," and so forth, unless otherwise stated, are not intended to require any preferred orientation and are made with reference to the orientation of the corresponding figure or figures for purposes of illustration or with reference to any other suitable orientations or axes.

It will be appreciated that the steps of various processes described herein are non-limiting examples of suitable processes according to embodiments and are for the purposes of illustration. Systems and devices according to embodiments herein may be use any suitable processes including those that omit steps described above, perform those steps and similar steps in different orders, and the like. It will also be appreciated that well-known features may be omitted for clarity.

Vertical displacement MEMS accelerometers, in which a proof mass is suspended above a substrate and oscillates up and down (i.e., moving closer to the substrate and farther from the substrate) can be desirable for use in certain applications due their comparatively high resonant frequencies. For example, the resonant frequency of a vertical displacement accelerometer with a 100μ×100μ silicon proof mass can be in the range of 10-100 kHz, allowing measurement of acceleration events that occur on timescales of 100-1000 μs. However, large area proof masses required to achieve such resonant frequencies can present a large surface area facing the substrate. These large surface areas can increase the risk of undesired stiction between the proof mass and the substrate should the proof mass contact the substrate or structures attached to the substrate. Various structures can be placed between the proof mass and the substrate to provide motion stops, but such structures can also result in undesired stiction or damage to the proof mass. Accordingly, embodiments described herein provide vertical displacement MEMS devices suitable for use in accelerometers with structures that prevent the proof mass from striking the substrate while reducing the risk of stiction.

FIG. 1 shows a plan view of an example vertical-displacement-type MEMS accelerometer according to one or more embodiments. The MEMS device 100 includes a proof mass 120 formed over a substrate 102 provided with anchors 110. The proof mass 120 is coupled to the substrate 102 via spring assemblies 130. Each spring assembly 130 is coupled to the proof mass 120 via a corresponding anchor 110. When the proof mass 120 is in a resting position (i.e., one in which the proof mass experiences no acceleration due to external forces other than gravity, the spring assemblies 130 are disposed within openings in the proof mass 120 and are surrounded by the proof mass 120. When the MEMS device 100 (and the attached proof mass 120) is subjected to a vertical acceleration (i.e., along an axis passing through the plane FIG. 1), the proof mass 120 is configured to translate up and down with the respect to the substrate 102, with its motion constrained by the spring assemblies 130, as will be described further below. This oscillatory vertical motion can then be converted into electrical signals using any suitable method (e.g., using a circuit that converts changes in capacitance between the proof mass and one or more electrodes into an electrical signal).

As shown in FIG. 1, in one or more embodiments a proof mass such as the proof mass 120 is has a square shape, and spring assemblies such as the spring assemblies 130 are arranged symmetrically about a center of the proof mass 120. As shown in FIG. 1, in one or more embodiments, anchors corresponding to each spring assembly such as the anchors 110 are arranged symmetrically along a circular path (e.g., the path 199 of FIG. 1) and each spring assembly extends from the corresponding anchor toward a corner of the proof mass.

As shown in FIG. 1, in one or more embodiments, a proof mass such as the proof mass 120 may include recesses or holes in one or more surfaces. Such configurations can be desirable to tune behavior of the MEMS (change mass by removing material, change damping by modifying gas flow through holes).

Figure 2:
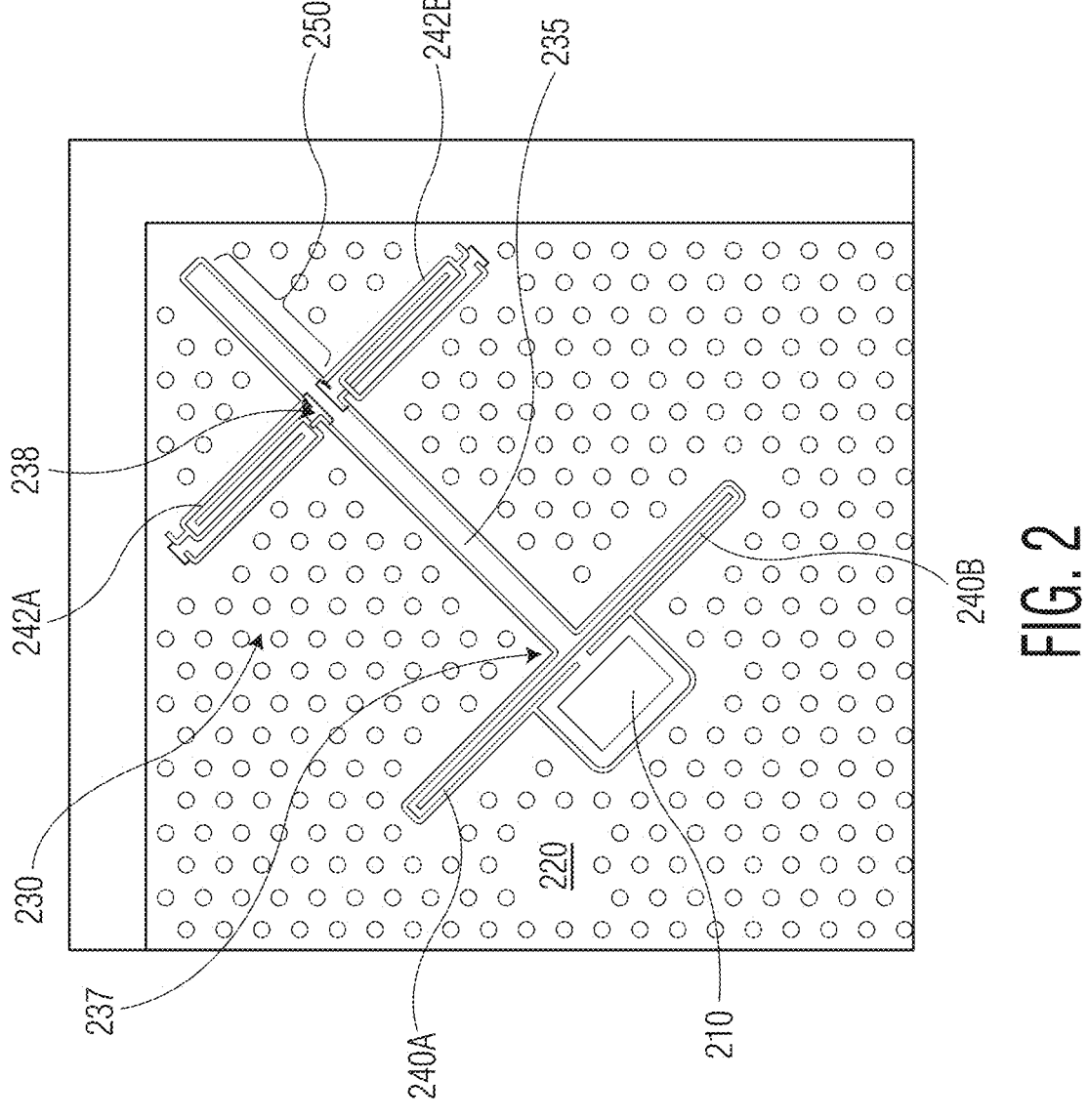
FIG. 2 is a plan view showing a spring assembly of the MEMS device of FIG. 1 in greater detail.

FIG. 2 shows details of an example spring assembly according to one or more embodiments. The spring assembly 230 (e.g., a spring assembly 130), has a long axis defined by a beam 235. The beam 235 extends from a first end that is proximal to a corresponding anchor 210 (e.g., an anchor 110) toward a free end 250 of the beam 235 that is distal to the anchor 210. The beam 235 is fixed to the anchor 210 at the pivot point 237 by a first linkage 240. The first linkage includes first linkage arms 240A and 240B which extend away from the beam 235 and are perpendicular to the long axis of the beam 235. The beam 235 is fixed to the anchor proof mass 220 at the pivot point 238 by a second linkage 242 that has linkage arms 242A and 242B which extend away from the beam 235 and are perpendicular to the long axis of the beam 235. In one or more embodiments, a first linkage such as the first linkage 240 is a torsional linkage and its linkage arms (e.g., the linkage arms 240A 240B) are individual torsional spring structures. In one or more embodiments, a second linkage such as the second linkage 242 is a torsional linkage and its linkage arms (e.g., the linkage arms 242A, 242B are individual torsional spring structures).

Figure 3:
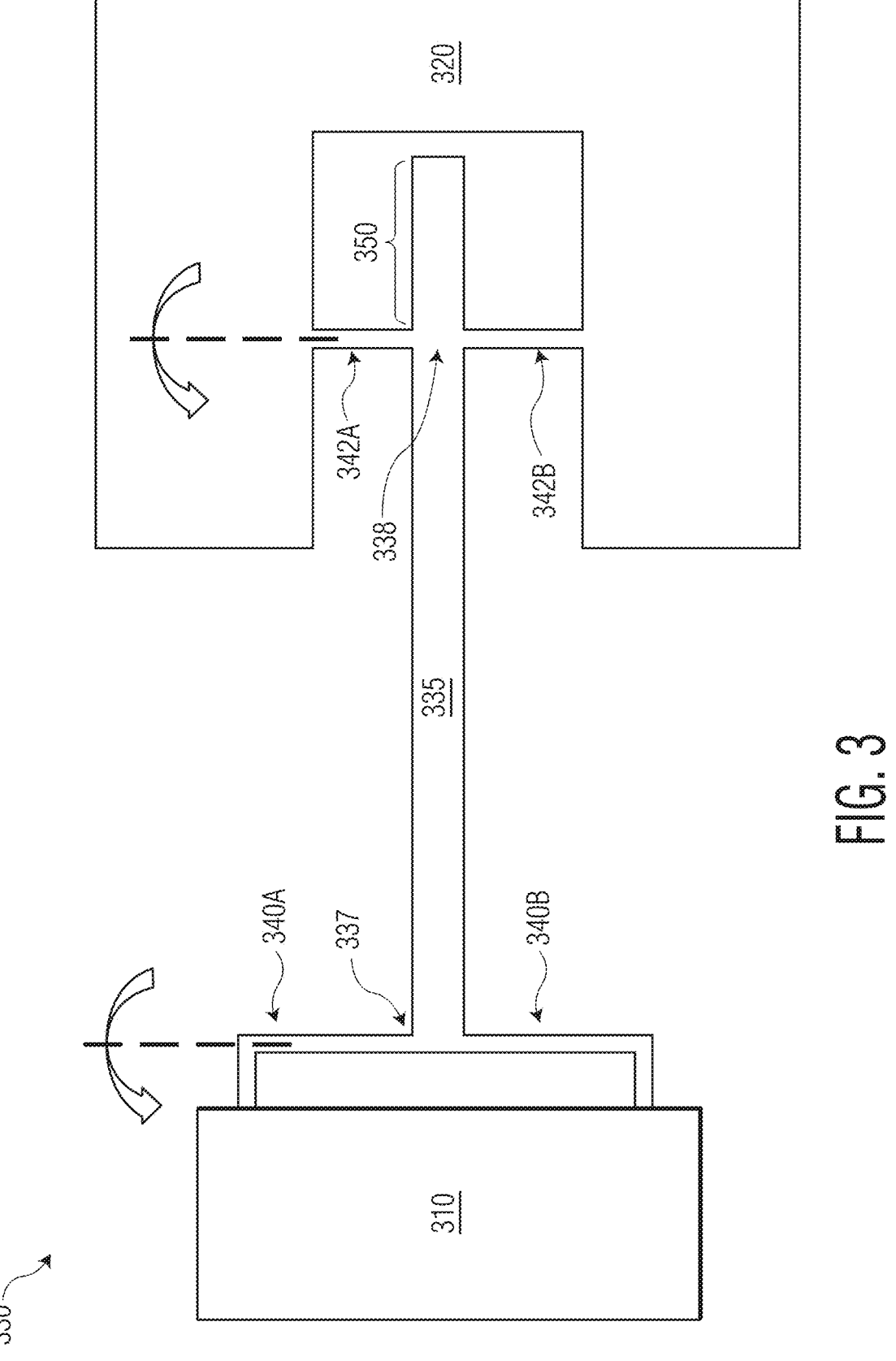
FIG. 3 is a schematic plan view of the spring assembly of FIG. 2 illustrating features of linkages of the spring assembly.

FIG. 3 is a schematic plan view illustrating aspects of the operation of a spring assembly according to one or more embodiments. The beam 335 of the spring assembly 330 (e.g., a spring assembly 130/330) is coupled to the anchor 310 (e.g., an anchor 110/210) at the pivot point 337 proximal to the anchor 310. The beam 335 is coupled to the proof mass 320 (e.g., a proof mass 120/220) at the pivot point 338 distal to the anchor 310. A first linkage 340 is formed by the arms 340A and 340B and a second linkage 342 is formed by the linkage arms 342A, 342B. As shown, the first linkage 340 and the second linkage 342 act as torsion springs that allow the beam 335 to pivot about the pivot points 337, 338. The portion of the beam 335 that extends beyond the pivot point 338 and away from the anchor 310 is the free end 350 (e.g., a free end 250). The second linkage 342 (i.e., the linkage arms 342A, 342B) is configured such that the free end 350 can translate vertically (i.e., in and out of the plane of FIG. 3) relative to the proof mass 320, as described below in connection with FIG. 4A and FIG. 4B.

Figure 4A:
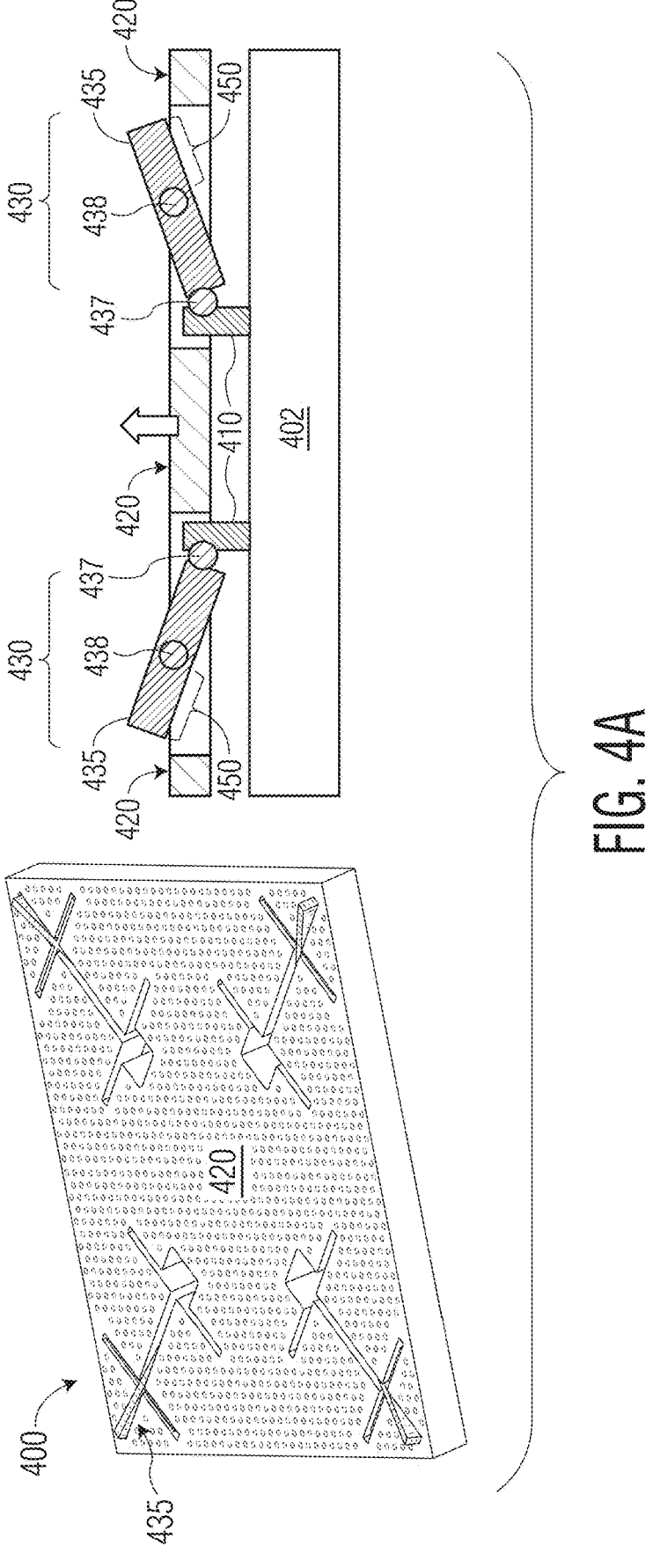
FIG. 4A is a cross-sectional view illustrating relative displacements of components of the MEMS device of FIG. 1 when the proof mass has a maximum positive (upward) vertical displacement relative to its rest position.
Figure 4B:
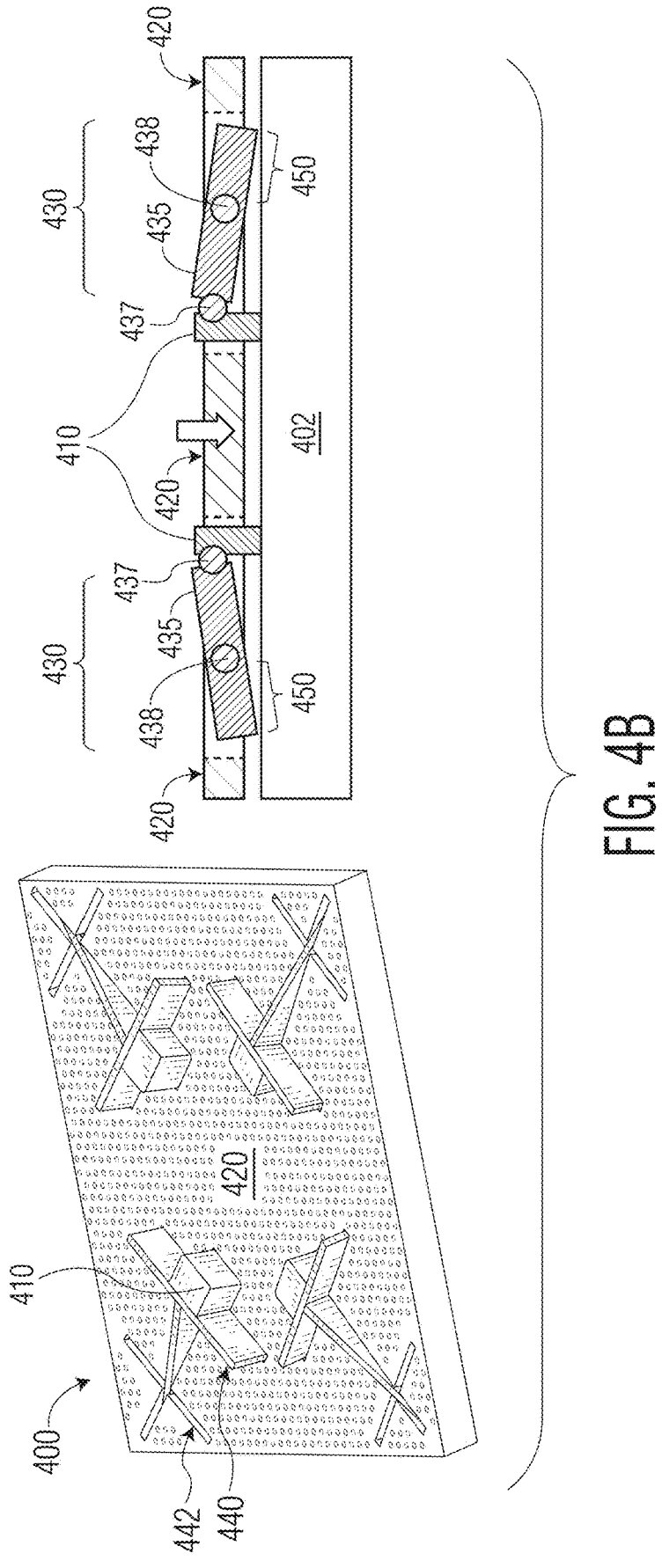
FIG. 4B is a cross-sectional view illustrating relative displacements of components of the MEMS device of FIG. 1 when the proof mass has a maximum negative (downward) vertical displacement relative to its rest position.

FIG. 4A and FIG. 4B each show a schematic cross-sectional view of an example MEMS device (the MEMS device 400; e.g., a MEMS die 100/200/300) according to one or more embodiments (left) and a cross-sectional schematic view (right) along a plane that is parallel to the long axes of two spring assemblies 430 of the MEMS device 400 in two different displacement states.

FIG. 4A illustrates relative displacements of the proof mass 420 and the beams 435 when the displacement of the proof mass 420 is greatest in the positive z direction (i.e., when the proof mass 420 is farthest from the substrate 402). As can be seen from the perspective and cross-sectional views of FIG. 4A, in this displacement state, the proof mass 420 extends above the anchors 410 and most of the beams 435. The fixed ends 437 of the beams 435 are coupled to their respective anchors 410. Meanwhile the free ends 450 of the beams 435 (i.e., the portions of the beams 435 between the pivot points 438 and the corners of the proof mass 420) pivot such that they extend above proof mass 420. In other words, the linkages 440, the linkages 442, and the beams 435 are all configured such that the beams 435 have a greater range of motion than the proof mass 420.

FIG. 4B illustrates relative displacements of the proof mass 420 and the beams 435 when the displacement of the proof mass 420 is greatest in the negative z direction (i.e., when the proof mass 420 is closest to the substrate 402). As can be seen from the perspective and cross-sectional views of FIG. 4B, in this displacement state, the anchors 410 protrude above the top surface of the proof mass 420. The fixed ends 437 of the beams 435 remain coupled to their respective anchors 410. Meanwhile the free ends 450 of the beams 435 pivot to contact the surface of the substrate 402. Because the proof mass 420 is coupled to the beams 435 at the pivot points 438, the proof mass 420 is prevented from contacting the substrate 402. Because the beams 435 only contact the substrate 402 at the edges of their respective free ends 450, the contact area (and thus the risk of stiction) can be reduced.

MEMS devices such as those described herein can experience thermally-induced expansion or contraction of the substrate and anchors. Such deformations can cause errors in accelerometer outputs (e.g., because thermal expansion has caused the proof mass to move closer to the substrate or farther away from the substrate). For example, a device may produce a signal that indicates a non-zero acceleration when the device is not subject to any acceleration. Because such offsets are thermally-induced, the magnitude and direction of these offsets will often depend upon the temperature of the device.

Figure 5:
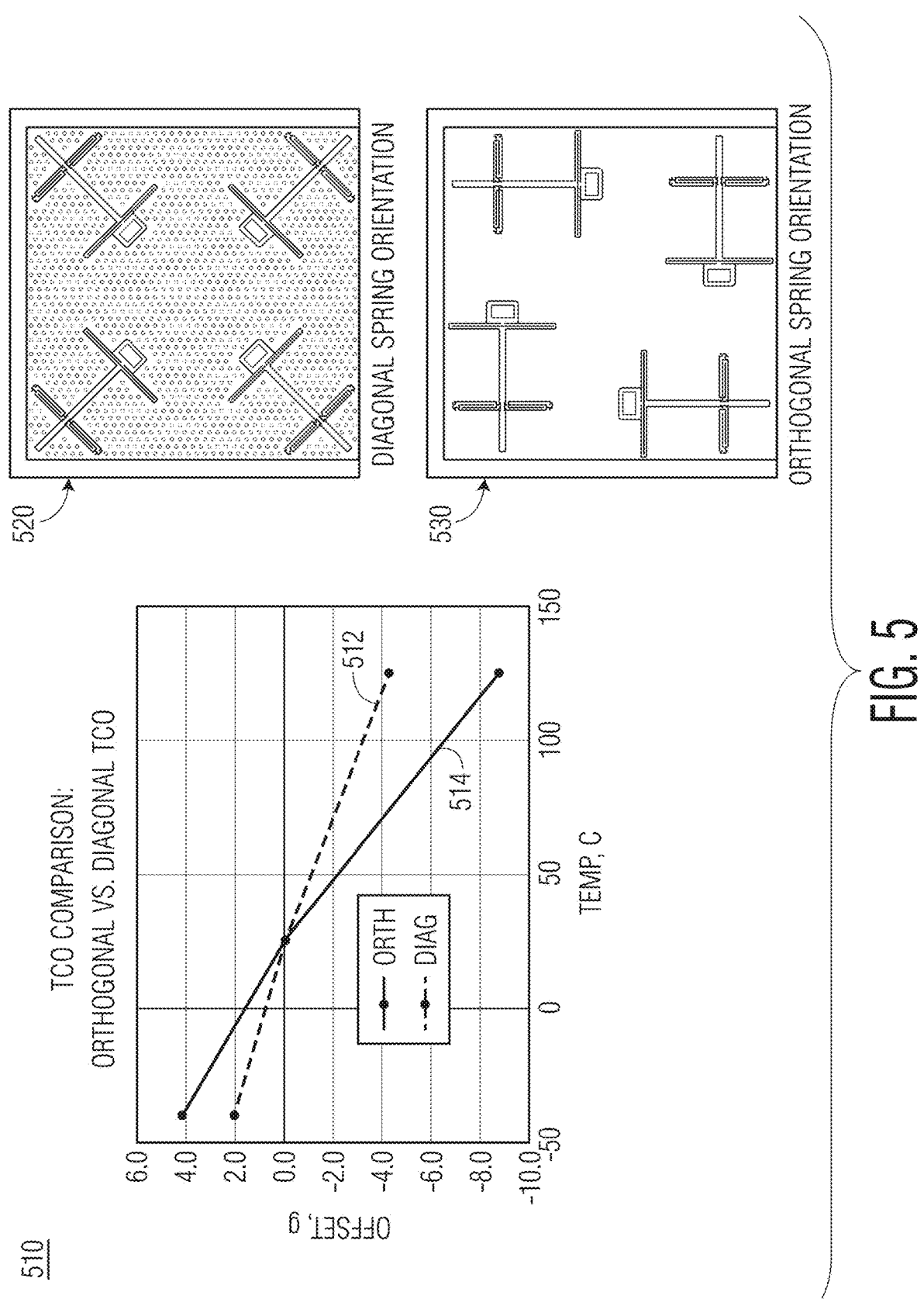
FIG. 5 depicts simulation results demonstrating improved performance of an accelerometer according to one or more embodiments relative to an alternative design.

Device performance can be improved by arranging anchors symmetrically and by locating these anchors near center of the MEMS device. Central placement of the anchors can be enabled by using a diagonal spring arrangement such as those depicted in the examples of FIG. 1 and FIG. 4. The symmetrical arrangements of the spring assemblies pictured in the example of FIG. 1 and the examples of FIG. 4 can confer certain advantages, as illustrated by FIG. 5 which shows a plot 510 of the relationship between offset (accelerometer reading under zero acceleration) and temperature for two MEMS devices represented, respectively, by the plan view 520 and the plan view 530 of FIG. 5.

The curve 512 of the plot 510 represents the offset vs. temperature relationship for the arrangement of springs depicted in the plan view 520, corresponding to an arrangement according to one or more embodiments such as depicted in FIG. 1 and FIG. 4. Meanwhile, the curve 514 of the plot 510 represents the offset vs. temperature relationship for the arrangement of springs depicted in the plan view 530, corresponding to previous approaches in which springs are arranged with their long axes perpendicular to the long axes of each directly adjacent spring. It will be appreciated that the offset for the arrangement shown in the plan view 520 is of equal or lesser magnitude than the offset for the arrangement shown in the plan view 530 across the temperature range shown.

EXAMPLE EMBODIMENTS

Example 1: A device or method of forming such a device that includes a set of spring assemblies; and a proof mass suspended above the substrate and coupled to the substrate by the set of spring assemblies. The proof mass is configured to move along a vertical direction toward and away from the substrate when the proof mass experiences an acceleration force along the vertical direction. Each spring assembly belonging to the set of spring assemblies includes an anchor disposed on the substrate and a beam having a fixed end and free end. The fixed end is coupled to the substrate and the free end is free to translate vertically with respect to the proof mass and free to translate vertically with respect to the substrate. Each spring assembly also includes a first linkage coupling the fixed end of the beam to the anchor and a second linkage coupling the beam to the proof mass at a location between the fixed end and the free end of the beam.

The anchors of each spring assembly are disposed symmetrically along a circular path centered around a center of the proof mass. When the proof mass is at rest, the spring assemblies are disposed within openings in the proof mass. The beam of each spring assembly extends from the anchor of that spring assembly toward a corresponding corner of the proof mass and a long axis of the beam of each spring assembly is oriented toward the center of the proof mass.

The spring assemblies and the proof mass are jointly configured such that, when a vertical displacement of the proof mass toward the substrate reaches a predefined value, the free end of each spring assembly contacts the substrate and prevents the proof mass from contacting the substrate.

Example 2: the method or device of Example 1 in which, when the proof mass is vertically displaced from a resting position, the proof mass is vertically displaced with respect to the fixed end of the beam of each spring assembly.

Example 3: the method or device of Example 1 or Example 2 in which the first linkage of each spring assembly is a torsional spring having two arms that extend away from the beam in opposite directions along an axis that is perpendicular to a long axis of the beam extends from the fixed end to the free end.

Example 4: the device or method of any of Examples 1-3 in which each of two arms of the first linkage of each spring assembly is coupled to the anchor corresponding to that spring assembly at a location that lies along the long axis of the beam.

Example 5: the device or method of any of Examples 1-4 wherein the second linkage of each spring assembly is a torsional spring having two arms that extend away from the beam in opposite directions along an axis that is perpendicular to a long axis of the beam that extends from the fixed end to the free end.

Example 6: the device or method of any of Examples 1-5 wherein each arm of two arms of the second linkage of each spring assembly has a proximal end that is proximal to the beam and a distal end that that is distal to the beam; and the distal end of each arm of the second linkage of each spring assembly is coupled to the proof mass.

Example 7: the device or method of any of Examples 1-6 in which the set of spring assemblies includes at least 4 spring assemblies disposed symmetrically along the circular path centered around the center of the proof mass.

The preceding detailed description and examples are merely illustrative in nature and are not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, or detailed description.

It should be understood that this invention is not limited in its application to the details of construction and the arrangement of components set forth in the preceding description or illustrated in the accompanying drawings. The invention is capable of other embodiments and of being practiced or of being carried out in various ways. Also, it is to be understood that the phraseology and terminology used herein is for the purpose of description and should not be regarded as limiting. The use of "including," "comprising," or "having" and variations thereof herein is meant to encompass the items listed thereafter and equivalents thereof as well as additional items. Unless specified or limited otherwise, the terms "mounted," "connected," "supported," and "coupled" and variations thereof are used broadly and encompass both direct and indirect mountings, connections, supports, and couplings. Further, "connected" and "coupled" are not restricted to physical or mechanical connections or couplings.

The preceding discussion is presented to enable a person skilled in the art to make and use embodiments of the invention. Various modifications to the illustrated embodiments will be readily apparent to those skilled in the art, and the generic principles herein can be applied to other embodiments and applications without departing from embodiments of the invention. Thus, embodiments of the invention are not intended to be limited to embodiments shown, but are to be accorded the widest scope consistent with the principles and features disclosed herein. The preceding detailed description is to be read with reference to the figures, in which like elements in different figures have like reference numerals. The Figures, which are not necessarily to scale, depict selected embodiments and are not intended to limit the scope of embodiments of the invention. Skilled artisans will recognize the examples provided herein have many useful alternatives and fall within the scope of embodiments of the invention.

The connecting lines shown in the various figures contained herein are intended to represent exemplary functional relationships and/or physical couplings between the various elements. It should be noted that many alternative or additional functional relationships or physical connections may be present in one or more embodiments of the subject matter. In addition, certain terminology may also be used herein for the purpose of reference only, and thus are not intended to be limiting, and the terms "first," "second" and other such numerical terms referring to structures do not imply a sequence or order unless clearly indicated by the context.

The foregoing description refers to elements or nodes or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with, electrically or otherwise) another element, and not necessarily mechanically. Thus, although the schematic shown in the figures depict one exemplary arrangement of elements, additional intervening elements, devices, features, or components may be present in one or more embodiments of the depicted subject matter.

What is claimed is:

1. A microelectromechanical system (MEMS) device comprising:
   a substrate;
   a set of spring assemblies; and
   a proof mass suspended above the substrate and coupled to the substrate by the set of spring assemblies and configured to move along a vertical direction toward and away from the substrate when the proof mass experiences an acceleration force along the vertical direction;
   wherein each spring assembly belonging to the set of spring assemblies comprises:
   an anchor disposed on the substrate;
   a beam having a fixed end and free end, wherein the fixed end is coupled to the substrate and the free end is free to translate vertically with respect to the proof mass and free to translate vertically with respect to the substrate;
   a first linkage coupling the fixed end of the beam to the anchor; and
   a second linkage coupling the beam to the proof mass at a location between the fixed end and the free end of the beam;
   wherein the anchors of each spring assembly are disposed symmetrically along a circular path centered around a center of the proof mass;
   wherein, when the proof mass is at rest, the spring assemblies are disposed within openings in the proof mass;
   wherein the beam of each spring assembly extends from the anchor of that spring assembly toward a corresponding corner of the proof mass and a long axis of the beam of each spring assembly is oriented toward the center of the proof mass; wherein the spring assembly is not in contact with the corresponding corner;
   wherein the spring assemblies and the proof mass are jointly configured such that, when a vertical displacement of the proof mass toward the substrate reaches a predefined value, the free end of each spring assembly contacts the substrate and prevents the proof mass from contacting the substrate;
   and wherein each anchor of each spring assembly disposed along the circular path are further disposed on the circular path closest to a corner of the proof mass.

2. The MEMS device of claim 1:
   wherein, when the proof mass is vertically displaced from a resting position, the proof mass is vertically displaced with respect to the fixed end of the beam of each spring assembly.

3. The MEMS device of claim 1:
   wherein the first linkage of each spring assembly is a torsional spring having two arms that extend away from the beam in opposite directions along an axis that is perpendicular to a long axis of the beam extends from the fixed end to the free end.

4. The MEMS device of claim 3:

wherein each arm of the first linkage of each spring assembly is coupled to the anchor corresponding to that spring assembly at a location that lies along the long axis of the beam.

5. The MEMS device of claim 1:

wherein the second linkage of each spring assembly is a torsional spring having two arms that extend away from the beam in opposite directions along an axis that is perpendicular to a long axis of the beam that extends from the fixed end to the free end.

6. The MEMS device of claim 5:

wherein each arm of the second linkage of each spring assembly has a proximal end that is proximal to the beam and a distal end that that is distal to the beam; and wherein the distal end of each arm of the second linkage of each spring assembly is coupled to the proof mass.

7. The MEMS device of claim 1, wherein the set of spring assemblies includes at least 4 spring assemblies disposed symmetrically along the circular path centered around the center of the proof mass.

8. A microelectromechanical system (MEMS) device comprising:

a substrate;

a set of at least four spring assemblies; and a proof mass suspended above the substrate, coupled to the substrate by the set of spring assemblies, and configured to move along a vertical direction toward and away from the substrate when the proof mass experiences an acceleration force along the vertical direction;

wherein each spring assembly belonging to the set of spring assemblies comprises:

an anchor disposed on the substrate;

a beam having a fixed end and free end, wherein the fixed end is coupled to the substrate and the free end is free to translate vertically with respect to the proof mass and free to translate vertically with respect to the substrate;

a first linkage coupling the fixed end of the beam to the anchor; and a second linkage coupling the beam to the proof mass at a location between the fixed end and the free end of the beam;

wherein the anchors of each spring assembly are disposed symmetrically along a circular path centered around a center of the proof mass;

wherein, when the proof mass is at rest, the spring assemblies are disposed within openings in the proof mass;

wherein the beam of each spring assembly extends from the anchor of that spring assembly toward a corresponding corner of the proof mass and a long axis of the beam of each spring assembly is oriented toward the center of the proof mass wherein each spring assembly is not in contact with the corresponding corner; and wherein the spring assemblies and the proof mass are jointly configured such that, when a vertical displacement of the proof mass toward the substrate reaches a predefined value, the free end of each spring assembly contacts the substrate and prevents the proof mass from contacting the substrate; and wherein each anchor of each spring assembly disposed along the circular path are further disposed on the circular path closest to a corner of the proof mass.

9. A method comprising:

forming, on a substrate, a set of spring assemblies and proof mass;

wherein the proof mass is suspended above the substrate, coupled to the substrate by the set of spring assemblies, and configured to move along a vertical direction toward and away from the substrate when the proof mass experiences an acceleration force along the vertical direction;

wherein forming each spring assembly belonging to the set of spring assemblies comprises:

forming an anchor disposed on the substrate;

forming a beam having a fixed end and free end, wherein the fixed end is coupled to the substrate and the free end is free to translate vertically with respect to the proof mass and free to translate vertically with respect to the substrate;

forming a first linkage coupling the fixed end of the beam to the anchor; and forming a second linkage coupling the beam to the proof mass at a location between the fixed end and the free end of the beam;

wherein the anchors of each spring assembly are disposed symmetrically along a circular path centered around a center of the proof mass;

wherein, when the proof mass is at rest, the spring assemblies are disposed within openings in the proof mass;

wherein the beam of each spring assembly extends from the anchor of that spring assembly toward a corresponding corner of the proof mass and a long axis of the beam of each spring assembly is oriented toward the center of the proof mass;

wherein each spring assembly is not in contact with the corresponding corner;

wherein the spring assemblies and the proof mass are jointly configured such that, when a vertical displacement of the proof mass toward the substrate reaches a predefined value, the free end of each spring assembly contacts the substrate and prevents the proof mass from contacting the substrate; and wherein each anchors of each spring assembly disposed along the circular path are further disposed on the circular path closest to a corner of the proof mass.

10. The method of claim 9:

wherein, when the proof mass is vertically displaced from a resting position, the proof mass is vertically displaced with respect to the fixed end of the beam of each spring assembly.

11. The method of claim 9:

wherein the first linkage of each spring assembly is a torsional spring having two arms that extend away from the beam in opposite directions along an axis that is perpendicular to a long axis of the beam extends from the fixed end to the free end.

12. The method of claim 11:

wherein each arm of the first linkage of each spring assembly is coupled to the anchor corresponding to that spring assembly at a location that lies along the long axis of the beam.

13. The method of claim 9:

wherein the second linkage of each spring assembly is a torsional spring having two arms that extend away from the beam in opposite directions along an axis that is perpendicular to a long axis of the beam that extends from the fixed end to the free end.

14. The method of claim 13:

wherein each arm of the second linkage of each spring assembly has a proximal end that is proximal to the beam and a distal end that that is distal to the beam; and wherein the distal end of each arm of the second linkage of each spring assembly is coupled to the proof mass.

15. The method of claim 9, wherein the set of spring assemblies includes at least 4 spring assemblies disposed symmetrically along the circular path centered around the center of the proof mass.

* * * * *